(12) United States Patent
Anderson et al.

(10) Patent No.: US 9,059,080 B2
(45) Date of Patent: *Jun. 16, 2015

(54) METHODS OF FABRICATING TRENCH GENERATED DEVICE STRUCTURES

(71) Applicant: International Business Machines Corporation, Armonk, NY (US)

(72) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 181 days.

This patent is subject to a terminal disclaimer.

(21) Appl. No.: 13/764,355

(22) Filed: Feb. 11, 2013

(65) Prior Publication Data

US 2013/0171796 A1    Jul. 4, 2013

Related U.S. Application Data

(62) Division of application No. 12/552,354, filed on Sep. 2, 2009, now Pat. No. 8,497,529.

(60) Provisional application No. 61/159,818, filed on Mar. 13, 2009.

(51) Int. Cl.
*H01L 31/108* (2006.01)
*H01L 21/225* (2006.01)
*H01L 21/74* (2006.01)
(Continued)

(52) U.S. Cl.
CPC .......... *H01L 21/2254* (2013.01); *H01L 21/743* (2013.01); *H01L 21/76283* (2013.01); *H01L 21/8249* (2013.01); *H01L 27/0623* (2013.01)

(58) Field of Classification Search
CPC .. H01L 21/2255; H01L 21/2652; H01L 21/02
USPC ......................................... 438/235, 309, 312
See application file for complete search history.

(56) References Cited

U.S. PATENT DOCUMENTS

| 4,649,627 A | 3/1987 | Abernathey et al. |
| 4,994,406 A | 2/1991 | Vasquez et al. |

(Continued)

OTHER PUBLICATIONS

USPTO, Notice of Allowance issued in U.S. Appl. No. 12/111,266 dated Sep. 30, 2009.

(Continued)

*Primary Examiner* — Samuel Gebremariam
(74) *Attorney, Agent, or Firm* — Wood, Herron & Evans, LLP; Anthony J. Canale

(57) ABSTRACT

Methods for fabricating device structures, such as bipolar transistors and diodes. The method includes forming a trench extending through stacked semiconductor and insulator layers and into an underlying semiconductor substrate. The trench may be at least partially filled with a sacrificial plug containing a dopant with a conductivity type opposite to the conductivity type of the semiconductor substrate. Dopant is transported outwardly from the sacrificial plug into the semiconductor substrate surrounding the trench to define a doped region of the second conductivity type in the semiconductor substrate. A first contact is formed that extends through the semiconductor and insulator layers to a portion of the semiconductor substrate outside of the doped region. A second contact is formed that extends through the semiconductor and insulator layers to the doped region.

18 Claims, 5 Drawing Sheets

(51) Int. Cl.
*H01L 21/762* (2006.01)
*H01L 21/8249* (2006.01)
*H01L 27/06* (2006.01)

(56) References Cited

U.S. PATENT DOCUMENTS

| | | |
|---|---|---|
| 5,108,783 A | 4/1992 | Tanigawa et al. |
| 5,443,661 A | 8/1995 | Oguro et al. |
| 5,889,293 A | 3/1999 | Rutten et al. |
| 5,923,067 A | 7/1999 | Voldman |
| 5,930,107 A | 7/1999 | Rajeevakumar |
| 6,051,874 A | 4/2000 | Masuda |
| 6,103,564 A | 8/2000 | Masuda |
| 6,140,673 A | 10/2000 | Kohyama |
| 6,232,202 B1 | 5/2001 | Hong |
| 6,297,127 B1 | 10/2001 | Chen et al. |
| 6,303,413 B1 | 10/2001 | Kalnitsky et al. |
| 6,303,414 B1 | 10/2001 | Ang et al. |
| 6,337,253 B1 | 1/2002 | Davari et al. |
| 6,465,852 B1 | 10/2002 | Ju |
| 6,498,372 B2 | 12/2002 | Brown et al. |
| 6,667,226 B2 | 12/2003 | Pinto et al. |
| 6,670,677 B2 | 12/2003 | Choe et al. |
| 6,826,025 B2 | 11/2004 | Singh et al. |
| 6,833,602 B1 | 12/2004 | Mehta |
| 6,864,151 B2 | 3/2005 | Yan et al. |
| 6,885,080 B2 | 4/2005 | Chen et al. |
| 7,009,237 B2 | 3/2006 | Adkisson et al. |
| 7,019,348 B2 | 3/2006 | Tu |
| 7,242,071 B1 | 7/2007 | Liu et al. |
| 7,282,771 B2 | 10/2007 | Voldman |
| 8,159,008 B2 | 4/2012 | Anderson et al. |
| 2005/0106836 A1 | 5/2005 | Chen et al. |
| 2007/0178639 A1 | 8/2007 | Cecchi et al. |
| 2007/0287243 A1 | 12/2007 | Liu et al. |
| 2008/0036029 A1 | 2/2008 | Liu et al. |
| 2008/0092094 A1 | 4/2008 | Coolbaugh et al. |
| 2009/0267178 A1 | 10/2009 | Abadeer et al. |
| 2009/0269903 A1 | 10/2009 | Abadeer et al. |

OTHER PUBLICATIONS

USPTO, Notice of Allowance issued in U.S. Appl. No. 12/111,285 dated Oct. 6, 2009.
USPTO, Office Action issued in U.S. Appl. No. 12/562,419 dated May 31, 2011.
USPTO, Office Action issued in U.S. Appl. No. 12/552,354 dated Oct. 24, 2012.
USPTO, Notice of Allowance issued in U.S. Appl. No. 12/562,419 dated Dec. 14, 2011.

METHODS OF FABRICATING TRENCH GENERATED DEVICE STRUCTURES

CROSS-REFERENCE TO RELATED APPLICATIONS

This application is a divisional of application Ser. No. 12/552,354, filed Sep. 2, 2009, which claims the benefit of U.S. Provisional Application No. 61/159,818, filed Mar. 13, 2009. Each of these applications is hereby incorporated by reference herein in its entirety.

BACKGROUND

The invention relates generally to semiconductor device fabrication and, in particular, to methods of fabricating device structures, such as bipolar junction transistors and diodes, using a trench.

Bipolar junction transistors are typically found in demanding types of analog circuits, especially analog circuits used in high-frequency applications. For example, bipolar junction transistors are commonly used in radiofrequency integrated circuits (RFICs) found in wireless communications systems. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types.

A typical bipolar junction transistor includes three semiconductor regions, namely the emitter, base, and collector regions, of which the emitter and collector regions have an opposite conductivity type in comparison with the base region. Generally, a bipolar junction transistor includes a pair of p-n junctions, namely an emitter-base junction and a collector-base junction. An NPN-type bipolar junction transistor consists of a thin region of p-type semiconductor material constituting the base region sandwiched between two regions of n-type semiconductor material constituting the emitter and collector regions. A PNP-type bipolar junction transistor has two regions of p-type semiconductor material constituting the emitter and collector regions and a thin region of n-type semiconductor material constituting the base region sandwiched between them.

A voltage applied across the emitter-base junction controls the movement of charge carriers that produce charge flow between the collector and emitter regions. Because the collector region surrounds the emitter region, almost all of the charge carriers injected from the emitter into the base region are collected. As a result, a small current entering the base region of an NPN-type bipolar junction transistor, or flowing from the base region in the case of a PNP-type bipolar junction transistor, is highly amplified in the collector output. Because electron mobility is higher than hole mobility in silicon, NPN-type bipolar junction transistors offer greater currents and faster operation under most circumstances than PNP-type bipolar junction transistors. As a consequence, NPN-type bipolar junction transistors are the favored type of bipolar junction transistor found in RFIC's or BiCMOS integrated circuits.

Conventional planar bipolar junction transistors are commonly fabricated with vertical stacked arrangement of the emitter, base, and collector regions. In silicon-on-insulator (SOI) technology, a top, thin layer of silicon or SOI layer is employed to build active devices. Fabrication of bipolar junction transistors having a conventional vertically stacked arrangement can be difficult in such thin layers of silicon. Similar considerations apply for diodes that include a single p-n junction, as well as other device structures that may contain more than two p-n junctions. Although lateral p-n junctions can be built in thin SOI layers, the ideality of such diodes suffers, and is typically greater than unity. This degradation in ideality makes such diodes less than ideal for many analog applications, such local temperature monitors or band-gap reference voltage generators.

What is needed, therefore, are methods for fabricating device structures, such as bipolar junction transistors and diodes, that overcome these and other disadvantages of conventional fabrication methods for these types of device structures.

BRIEF SUMMARY

In an embodiment of the invention, a device structure is fabricated using a layer stack having a semiconductor layer, a semiconductor substrate, and an insulator layer between the semiconductor layer and the semiconductor substrate. The device structure includes a trench extending from a top surface of the semiconductor layer through the semiconductor and insulator layers into the semiconductor substrate and a doped region in the semiconductor substrate that extends about the trench. The doped region and the semiconductor substrate have opposite conductivity types. The device structure further includes a first contact extending from the top surface through the semiconductor layer and the insulator layer to a portion of the semiconductor substrate outside of the doped region. A second contact extends from the top surface through the semiconductor layer and the insulator layer to the doped region.

In another embodiment, the device structure is included in a design structure, which is embodied in a machine readable medium for designing, manufacturing, or testing an integrated circuit. The design structure may comprise a netlist. The design structure may also reside on storage medium as a data format used for the exchange of layout data of integrated circuits. The design structure may reside in a programmable gate array.

In yet another embodiment, a device structure is fabricated using a layer stack having a semiconductor layer, a semiconductor substrate, and an insulator layer between the semiconductor layer and the semiconductor substrate. The device structure includes first and second trenches each extending from a top surface of the semiconductor layer through the semiconductor layer and the insulator layer into the semiconductor substrate. A first doped region extends about the first trench in the semiconductor substrate and a second doped region extends about the second trench in the semiconductor substrate. The first and second doped regions each have an opposite conductivity type relative to the semiconductor substrate. The device structure further includes a first conductive stud in the first trench, a first dielectric liner separating the first conductive stud from at least the semiconductor substrate, a second conductive stud in the second trench, and a second dielectric liner separating the second conductive stud from at least the semiconductor substrate. A first contact extends from the top surface through the semiconductor layer and the insulator layer to a portion of the semiconductor substrate outside of the first and second doped regions. Second and third contacts respectively extend from the top surface through the semiconductor layer and the insulator layer to the first and second doped regions.

In an embodiment of the invention, a method is provided for fabricating a device structure using a layer stack having a semiconductor layer, a semiconductor substrate of a first conductivity type, and an insulator layer between the semiconductor layer and the semiconductor substrate. The method includes forming a trench extending from a top surface of the semiconductor layer through the semiconductor layer and the insulator layer into the semiconductor substrate. The trench is at least partially filling with a sacrificial plug composed of a doped material containing a dopant having a second conductivity type in the semiconductor substrate that is opposite to the first conductivity type. A concentration of a dopant is transported outwardly from the doped material of the sacrificial plug and into the semiconductor substrate surrounding the trench to define a doped region of the second conductivity type in the semiconductor substrate. The method further includes forming a first contact extending from the top surface through the semiconductor layer and the insulator layer to a portion of the semiconductor substrate outside of the doped region, and forming a second contact extending from the top surface through the semiconductor layer and the insulator layer to the doped region.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
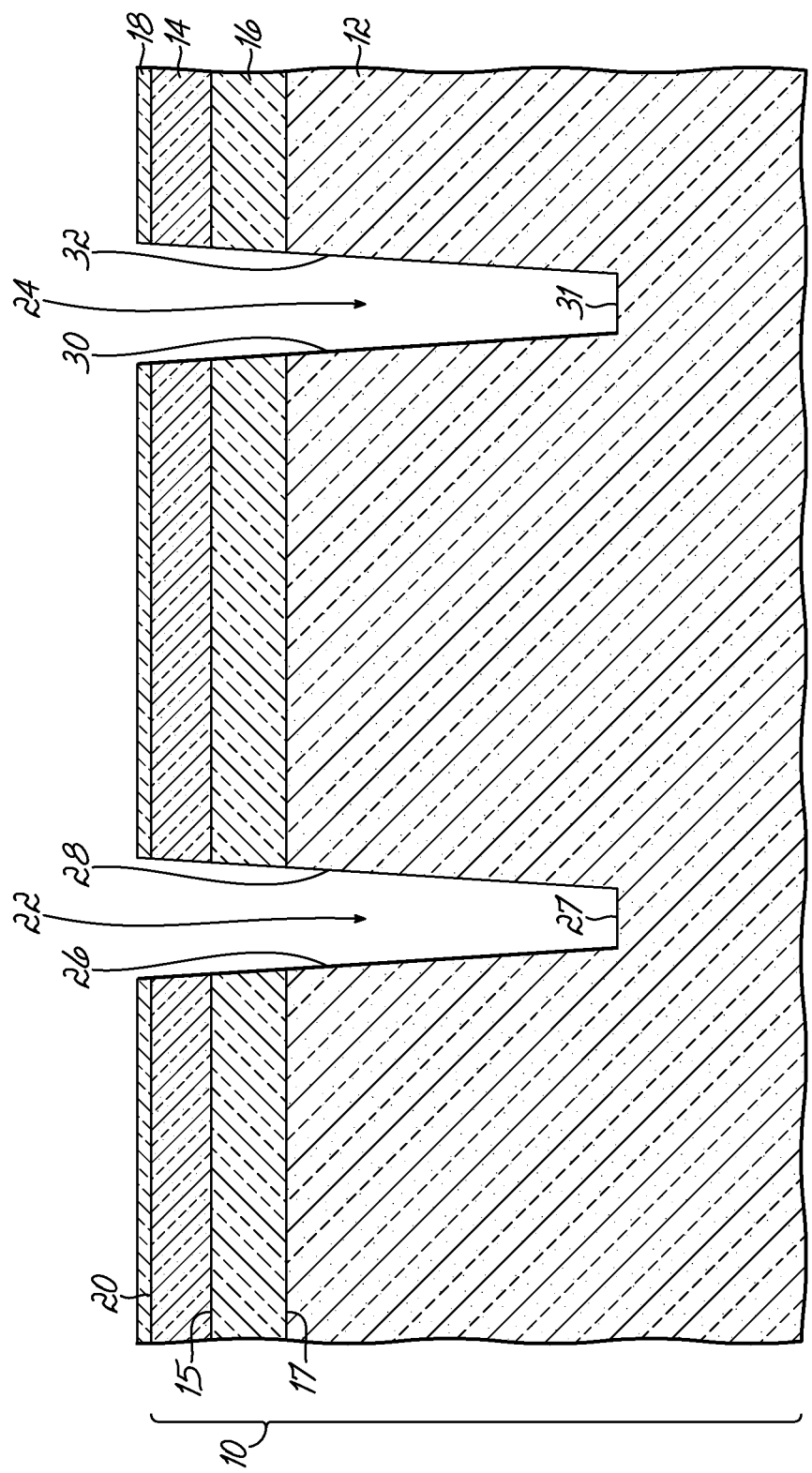
FIGS. 1-3 are diagrammatic cross-sectional views of a portion of a substrate at successive fabrication stages of a processing method for fabricating a device structure in accordance with an embodiment of the invention.

With reference to FIG. 1 and in accordance with an embodiment of the invention, a semiconductor-on-insulator (SOI) wafer 10 includes a handle substrate 12, an active semiconductor or SOI layer 14, and a buried insulator layer 16 formed of a dielectric material. The buried insulator layer 16 may be a buried oxide layer composed of silicon dioxide (e.g., $SiO_2$). The SOI layer 14 is separated from the handle substrate 12 by the intervening buried insulator layer 16. The SOI layer 14 is composed of single crystal or monocrystalline semiconductor material, such as silicon or another material that is primarily composed of silicon. The monocrystalline semiconductor material of the SOI layer 14 may contain a definite defect concentration and still be considered to be single crystal. The handle substrate 12 may also be constituted by a single crystal or monocrystalline semiconductor material, such as silicon, or another type of material. The buried insulator layer 16 electrically isolates the handle substrate 12 from the SOI layer 14, which is considerably thinner than the handle substrate 12 and is in direct contact with a top surface 15 of the buried insulator layer 16. After device structures are fabricated in product chips using the SOI wafer 10, a dicing operation is applied to produce multiple die, each carrying a completed replica of an integrated circuit.

A hardmask 18 is disposed on a top surface 20 of the SOI layer 14 across the SOI wafer 10. The material constituting the hardmask 18 is selected to etch selectively to the semiconductor material constituting the SOI layer 14 and to be readily removed at a subsequent fabrication stage. In one embodiment, hardmask 18 may be composed of $SiO_2$ deposited by a chemical vapor deposition (CVD) process or $SiO_2$ grown by oxidizing the SOI layer 14. Alternatively, the hardmask 18 may be composed of a different type of material, such as silicon oxynitride ($SiO_xN_y$), or a layered combination of materials, such as a layer of silicon nitride ($Si_3N_4$) and a thinner layer of $SiO_2$ between the $Si_3N_4$ layer and the top surface 20 of the SOI layer 14. The material contained in the hardmask 18 may be formed by a wet or dry thermal oxidation process, a CVD process, or a combination of these processes.

Deep trenches, of which deep trenches 22, 24 are representative, are formed by a conventional lithography and etching process at locations distributed across the surface of SOI wafer 10. Specifically, the hardmask 18 is patterned using a conventional lithography and etching process. The lithography process applies a resist layer (not shown) on hardmask 18, exposes the resist layer to a pattern of radiation through a photomask, and develops the transferred deep trench pattern in the exposed resist to pattern resist layer. The deep trench pattern is transferred to the hardmask 18 using the patterned resist layer as an etch mask for an anisotropic dry etching process, such as a reactive-ion etching (RIE) process or a plasma etching process. The etching process removes portions of the hardmask 18 exposed through the deep trench pattern in the patterned resist and stops vertically on the top surface 20 of the SOI layer 14. After etching concludes, the resist layer is stripped by, for example, plasma ashing or a chemical stripper.

The deep trench pattern is then transferred by an etching process from the patterned hardmask 18 through the SOI layer 14 and the buried insulator layer 16, and into the handle substrate 12 with an anisotropic dry etching process that may be constituted by, for example, a RIE or a plasma etching process. The etching process may be conducted in a single etching step or multiple etching steps with different etch chemistries. For example, an etch chemistry capable of removing the constituent semiconductor material selective to (i.e., with a significantly greater etch rate than) the material(s) constituting the hardmask 18 is employed to extend the pattern through the SOI layer 14. A different etch chemistry is then used to etch through the buried insulator layer 16, and then the initial etch chemistry is restored to etch into the handle substrate 12 and extend the deep trenches 22, 24 to a depth greater than a bottom surface 17 of the buried insulator layer 16. The depth of the deep trenches 22, 24 is determined by the desired device specifications. The hardmask 18 is then removed utilizing a conventional wet chemical stripping process, such as exposure to a solution containing a mixture of hydrofluoric and sulfuric acids.

Each of the deep trenches 22, 24 defines a trough or window extending completely through the thickness of SOI layer 14 and buried insulator layer 16. Deep trench 22 includes opposite sidewalls 26, 28 that extend through SOI layer 14 and the buried insulator layer 16 and that penetrate into the handle substrate 12 to a base or bottom wall 27. Sidewalls 26, 28 are oriented substantially perpendicular to the top surface 20 of SOI layer 14. Additional sidewalls (not shown) connect sidewalls 26, 28. Similarly, deep trench 24 includes opposite sidewalls 30, 32 that are similar to sidewalls 26, 28 and a base or bottom wall 31 similar to bottom wall 27.

Figure 2:
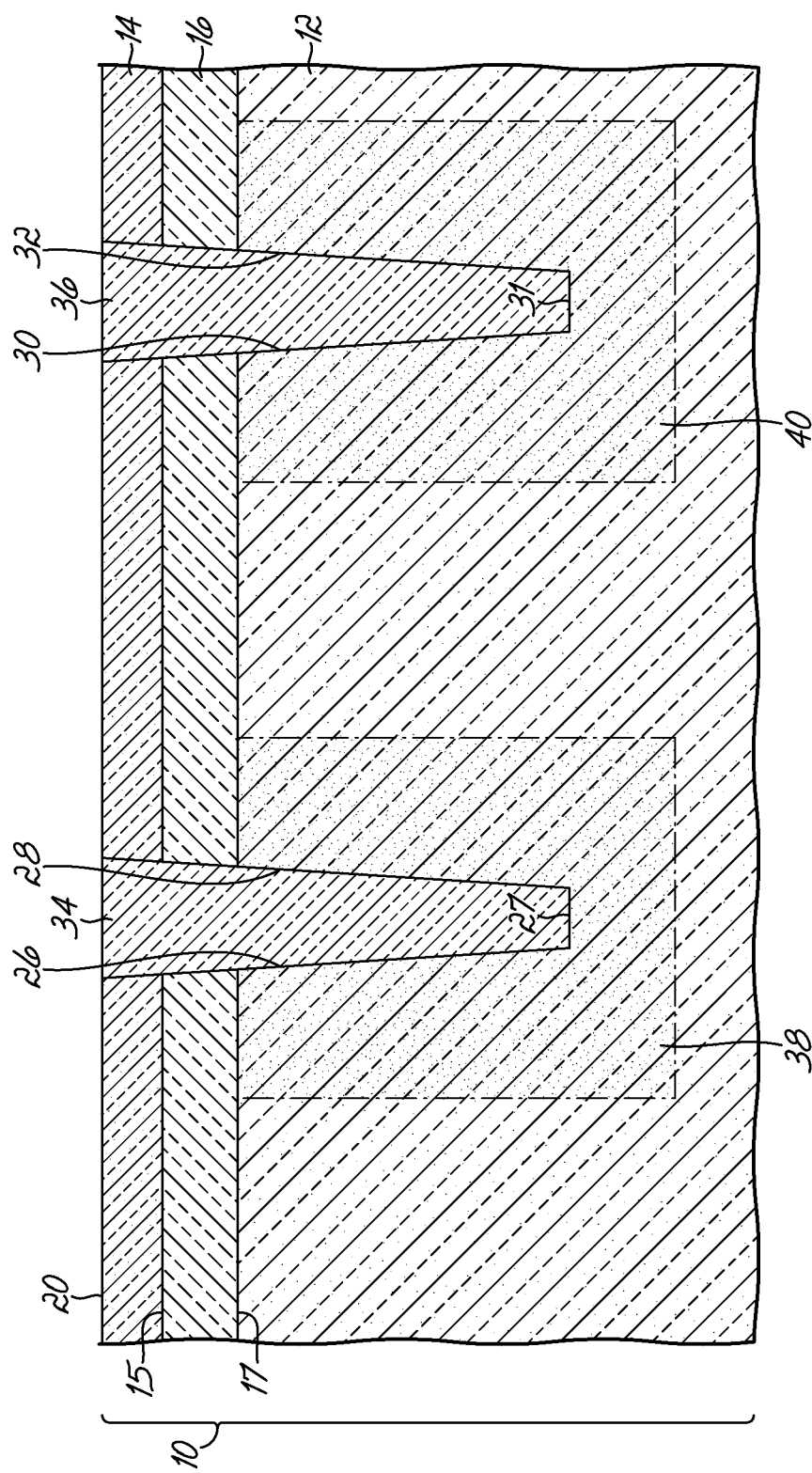

With reference to FIG. 2 in which like reference numerals refer to like features in FIG. 1 and at a subsequent fabrication stage, the deep trenches 22, 24 are filled with respective sacrificial plugs 34, 36 consisting of a material that contains a concentration of either a p-type dopant or an n-type dopant and that is readily removed from the deep trenches 22, 24. The sacrificial plugs 34, 36 may be composed of other types of sacrificial dielectric materials that include a dopant in a concentration sufficient to form the doped regions in the SOI layer 14 during a subsequent drive-in anneal. The doped material forming the sacrificial plugs 34, 36 may be deposited by a CVD process or another convention deposition technique. Extraneous doped material is removed from the top surface 20 of the SOI layer 14 by a planarization process, such as a chemical mechanical polishing (CMP) process.

In an alternative embodiment, the sacrificial plugs 34, 36 may be wet etched back to a depth below to a top surface 15 of the buried insulator layer 16 so that the SOI layer 14 is substantially uncoated by the doped material. In another alternative embodiment, the doped material in the sacrificial plugs 34, 36 may be deposited using, for example, a directional process, such as a high density plasma chemical vapor deposition (HDPCVD) process, that anisotropically deposits a thicker film on planar surfaces than on vertical surfaces. The directional deposition process may be halted before the deposited material level reaches the height of the SOI layer 14. Any extraneous doped material that deposits on the sidewalls 26, 28 of the portion of the deep trench 22 within the SOI layer 14 and the sidewalls 30, 32 of the portion of the deep trench 24 within the SOI layer 14 may be removed by a wet etch process such as buffered hydrofluoric (BHF), or by an isotropic dry etch process such as chemical dry etch (CDE) or chemical oxide removal (COR).

Sacrificial plug 34 is in direct contact with the sidewalls 26, 28 and bottom wall 27 of the deep trench 22 and sacrificial plug 36 is in direct contact with the sidewalls 30, 32 and bottom wall 31 of the deep trench 24. A relatively high concentration of dopant originating from each of the sacrificial plugs 34, 36 is transported outwardly from the doped material of each of the sacrificial plugs 34, 36 into the semiconductor material of the handle substrate 12. In one embodiment, the outward transport is promoted by solid phase diffusion or drive-in process that includes a thermal anneal at an elevated temperature. Diffusion mechanisms and suitable anneal temperatures for this process are understood by a person having ordinary skill in the art. The outward dopant diffusion, which is typically isotropic, functions to define doped regions 38, 40 in the semiconductor material of the handle substrate 12 that contain a relatively high impurity concentration of the dopant. The conductivity type of the outwardly diffused dopant contained in the doped regions 38, 40 is opposite to the conductivity type of the dopant contained in the handle substrate 12.

Doped region 38 extends about and circumscribes the sidewalls 26, 28 of the deep trench 22 and extends below the bottom wall 27 of the deep trench 22. Similarly, doped region 40 extends about and circumscribes the sidewalls 30, 32 of the deep trench 22 and extends below the bottom wall 31 of the deep trench 22. The sacrificial plugs 34, 36 may be composed of an n-type doped glass, such as arsenic-doped silicate glass (ASG) deposited by a CVD process. In other embodiments in which the resultant device structure is NPN-type, the semiconductor material of the doped regions 38, 40 may be heavily doped with a concentration of another dopant (e.g., an impurities species like antimony or phosphorus from Group V of the Periodic Table) effective to impart an n-type conductivity in which electrons are the majority carriers and dominate the electrical conductivity of the semiconductor material. In this embodiment, the semiconductor material of the handle substrate 12 is initially doped with a p-type dopant so that the constituent semiconductor material has p-type conductivity opposite to the n-conductivity type of the material in the sacrificial plugs 34, 36.

In an alternative embodiment of the invention, the sacrificial plugs 34, 36 may be composed of a p-type doped glass, such as a boron-doped silicate glass (BSG) deposited by a CVD process. In another embodiment in which the resulting device structure is PNP-type, the semiconductor material of the doped regions 38, 40 may be doped with another dopant (e.g., an impurity species like boron or indium from Group III of the Periodic Table) effective to impart a p-type conductivity in which holes are the majority carriers and dominate the electrical conductivity of the semiconductor material. In this particular embodiment, the semiconductor material of the handle substrate 12 is initially doped with an n-type dopant so that the constituent semiconductor material has n-type conductivity opposite to the p-conductivity type of the material in the sacrificial plugs 34, 36.

After the solid phase diffusion process is completed, the sacrificial plugs 34, 36 are removed from the deep trenches 22, 24. In one embodiment, the doped material of the sacrificial plugs 34, 36 may be removed by stripping using a wet etchant solution, such as a solution of buffered hydrofluoric acid.

In a process flow building memory cells for an embedded dynamic random access memory (eDRAM), a similar process involving deep trenches and sacrificial plugs is frequently used during the fabrication of a doped region for a buried capacitor included in each memory cell. Consequently, the process forming the doped regions 38, 40 with deep trenches 22, 24 and sacrificial plugs 34, 36 may be executed in conjunction with a process flow fabricating memory cells of an eDRAM using the SOI wafer 10.

Figure 3:
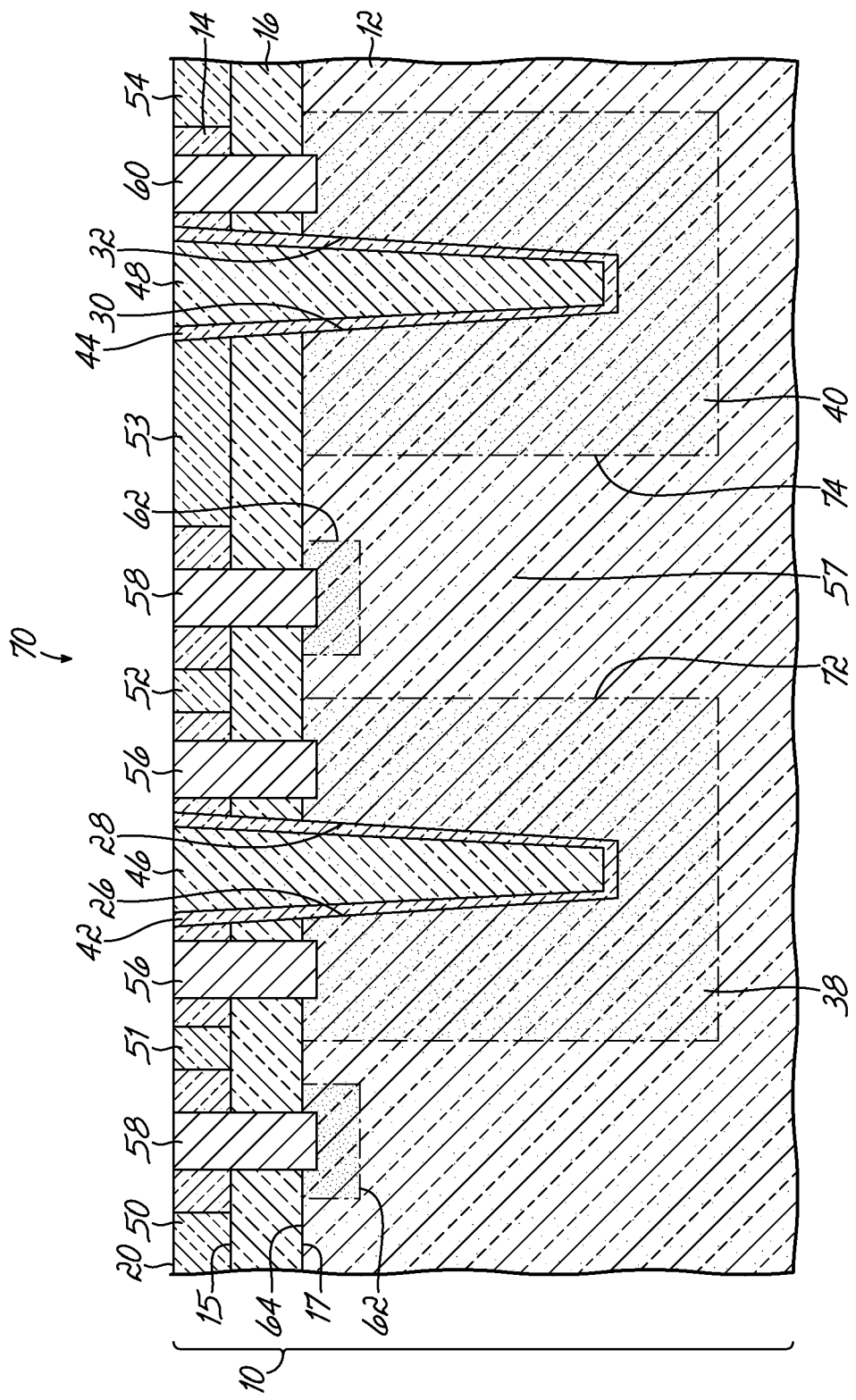

With reference to FIG. 3 in which like reference numerals refer to like features in FIG. 2 and at a subsequent fabrication stage, deep trench 22 is filled with an insulating liner 42 and a conductive stud 46 and, similarly, deep trench 24 is filled with an insulating liner 44 and a conductive stud 48. The insulating liners 42, 44 separate the conductive studs 46, 48 from the handle substrate 12, the SOI layer 14, and the buried insulator layer 16.

After sacrificial plugs 34, 36 are removed, the insulating liners 42, 44 are respectively applied to the sidewalls 26, 28 and bottom wall 27 of the empty deep trench 22 and the sidewalls 30, 32 and bottom wall 31 of the empty deep trench 24. The insulating liners 42, 44 may be composed of any suitable dielectric material or combination of dielectric materials deposited in a conventional manner. In one embodiment, the insulating liners 42, 44 are composed of a bilayer of $SiO_2$ and $Si_3N_4$. Conductive studs 46, 48 may be composed of a conductive material, such as doped polycrystalline silicon (polysilicon), and may be formed in the deep trenches 22, 24 by a conventional deposition technique, such as a CVD process or a physical vapor deposition (PVD) process. The conductor contained in the studs 46, 48 is doped to have the same conductivity type as the doped regions 38, 40. As an example, the conductive material in studs 46, 48 may be doped in situ during the deposition process with an n-type dopant if the doped regions 38, 40 are likewise doped with an n-type dopant. Extraneous dielectric material and conductive material may be removed from the top surface 20 of the SOI layer 14 by a planarization process, such as a CMP process. The conductive studs 46, 48 are electrically connected, respectively, with the doped regions 38, 40 of in the handle substrate 12.

The SOI layer 14 is modified to incorporate shallow trench isolation regions, of which shallow trench isolation regions 50, 51, 52, 53, 54 are representative, that extend through the SOI layer 14 to directly contact the top surface 15 of the buried insulator layer 16. The dielectric material contained in the shallow trench isolation regions 50, 51, 52, 53, 54 may comprise $SiO_2$, and can be formed using standard techniques. For example, shallow trenches may be defined in the SOI layer 14 using standard lithography and anisotropic dry etching, filled with amounts of dielectric material, such as an oxide like densified tetraethylorthosilicate (TEOS) deposited by a CVD process or a high density plasma (HDP) oxide, and planarized by a CMP process. Planarization removes extraneous dielectric material from the top surface 20 of the SOI layer 14.

A contact 56 to doped region 38, a contact 58 to a region 57 of the handle substrate 12 disposed between the doped regions 38, 40, and a contact 60 to the doped region 40 are formed that extend completely through the SOI layer 14 and buried insulator layer 16. The contacts 56, 58, 60 are composed of a material having a relatively high electrical conductivity in comparison to the semiconductor material constituting the SOI layer 14 and the dielectric material contained in the buried insulator layer 16. In various embodiments, the contacts 56, 58, 60 may be composed of various different metals or metal alloys including, but not limited to, tungsten or a tungsten alloy.

The contacts 56, 58, 60 may be formed by patterning the SOI layer 14 and buried insulator layer 16 using a conventional lithography and etching process to define respective trenches and then filling the trenches with respective masses of a conductor. The lithography process entails applying a resist (not shown) and a hardmask (not shown) on the top surface 20 of the SOI layer 14, exposing the resist to a pattern of radiation to create a latent pattern of the trenches in the resist for the contacts 56, 58, 60, developing the latent pattern in the exposed resist, transferring the developed pattern to the hardmask with a dielectric etching process, and stripping the residual resist with plasma ashing or a chemical stripper. The pattern is transferred from the hard mask to the SOI layer 14 and buried insulator layer 16 by an anisotropic etching process, such as RIE, that may be conducted in a single etching step or in multiple etching steps with different etch chemistries. After etching is concluded, the hardmask is removed. The resulting trenches for contacts 56, 58, 60 extend in a vertical direction substantially transverse to a plane containing the top surface 20 of the SOI layer 14. The contacts 56, 58, 60 are then formed by filling the trenches with conductor masses by depositing a blanket layer of a suitable conductor and planarizing to the top surface 20 of the SOI layer 14 using, for example, a CMP process.

A contact region 62 may be formed in the handle substrate 12 after the trench for contact 58 is formed, but before filling with the conductor mass. The contact region 62 is heavily doped with the same dopant type as the handle substrate 12 implemented by, for example, an ion implantation process. Energetic ions characterized by a suitable dopant type and kinetic energy are introduced with trajectories that traverse the trench for contact 58, enter the semiconductor material of the handle substrate 12 at the trench base, and stop at a shallow depth beneath a top surface 64 of the handle substrate 12.

A device structure, which is generally indicated by reference numeral 70, results that may either have an NPN construction or a PNP construction characterized by a pair of p-n junctions characteristic of a bipolar junction transistor. The specific construction is contingent upon the doping of the semiconductor material during processing. The device structure 70 includes the handle substrate 12, which operates as a base region of the bipolar junction transistor, and doped regions 38, 40 that operate respectively as the emitter and collector regions characteristic of the bipolar junction transistor.

The base region of the device structure 70 defined by the handle substrate 12 has an opposite conductivity type in comparison with the emitter and collector regions of the device structure 70, which are respectively represented by the doped regions 38, 40. The base region defined by the region 57 of the handle substrate 12 physically separates the emitter region defined by doped region 38 from the collector region defined by doped region 40. Hence, the emitter, base, and collector regions of the device structure 70 have a lateral arrangement within the handle substrate 12.

A p-n junction 72 is defined along the interface of direct contact between the oppositely doped semiconductor materials in doped region 38 and handle substrate 12. Another p-n junction 74 is defined along the interface of direct contact between the oppositely doped semiconductor materials in doped region 40 and handle substrate 12. P-n junction 72 functions as an emitter-base junction in the device structure 70. P-n junction 74 functions as a collector-base junction in the device structure 70. Each of the p-n junctions 72, 74 is delineated by a locus of points spatially tracing a transition between the opposite conductivity types for which the net doping concentration is null or zero.

In one embodiment in which the device structure 70 is an NPN-type bipolar transistor, the doped regions 38, 40 of the SOI layer 14 contain a moderate concentration of an n-type impurity species, and the handle substrate 12 may be doped with a concentration of a p-type impurity species. Although illustrated as having an NPN doping configuration for the collector region, base region, and emitter region, the fabrication of the device structure 70 may be modified to provide a PNP doping scheme for the collector region, base region, and emitter region as understood by a person having ordinary skill in the art.

During the fabrication process, the device structure 70 is replicated across at least a portion of the surface area of the SOI layer 14 of the SOI wafer 10. Standard processing follows, which includes formation of metallic contacts, metallization for the M1-level local interconnect wiring, and interlayer dielectric layers, conductive vias, and metallization for upper level (M2-level, M3-level, etc.) interconnect wiring.

Figure 4:
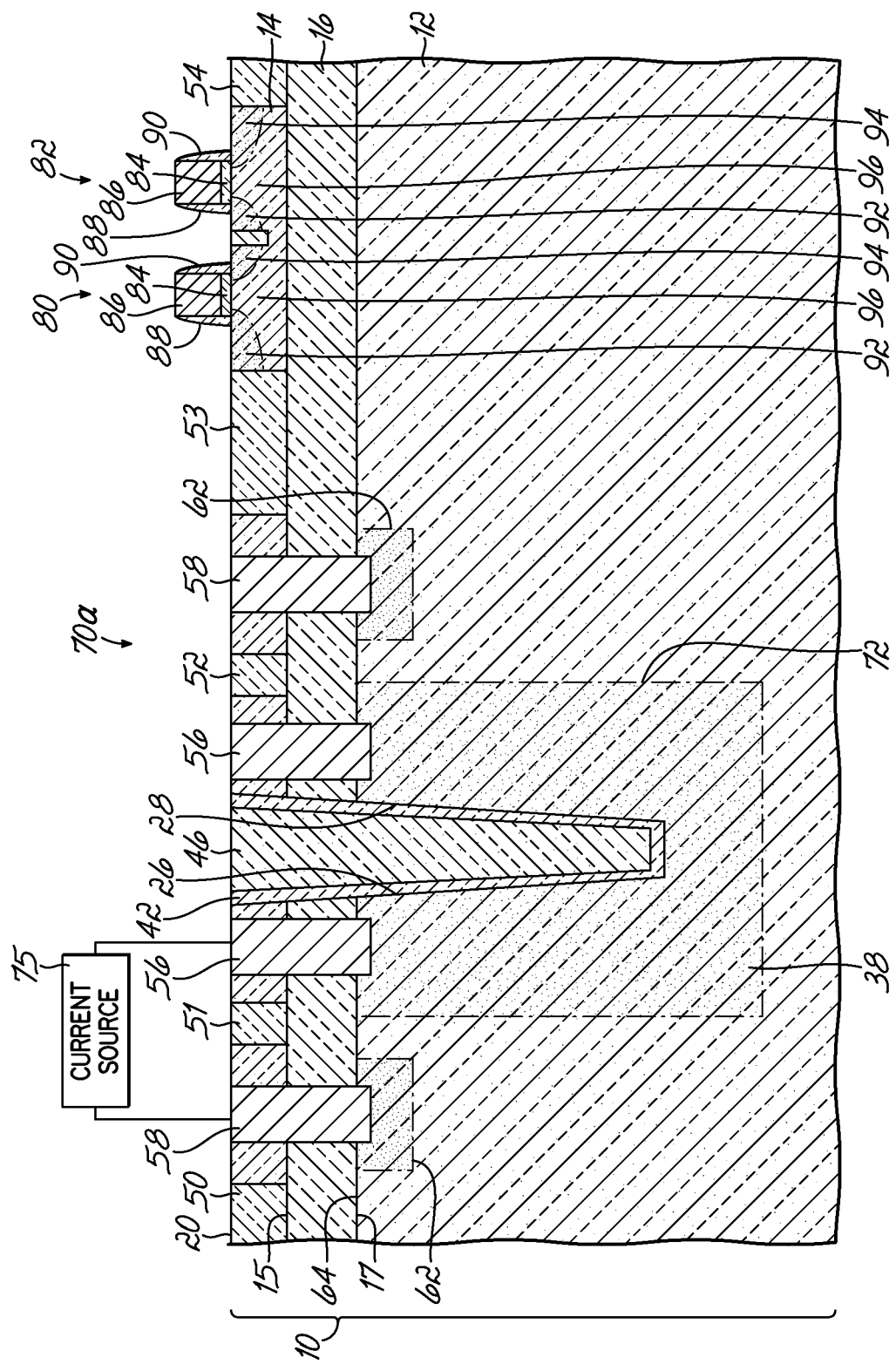
FIG. 4 is a schematic view similar to FIG. 3 of a device structure in accordance with an alternative embodiment of the invention.

With reference to FIG. 4 in which like reference numerals refer to like features in FIG. 3 and in accordance with an alternative embodiment of the invention, another device structure 70a includes only doped region 38, contacts 56, 58, and contact region 62. In this embodiment, there is only a single p-n junction 72, doped region 38 operates as a cathode of the device structure 70a that is contacted by contact 56, and the handle substrate 12 operates as an anode of the device structure 70a contacted by contact 58 and contact region 62. Because of this construction, the p-n junction of the device structure 70a functions as a diode.

Field effect transistors 80, 82 are fabricated using standard CMOS processing on different regions of the SOI layer 14. Each of the field effect transistors 80, 82 includes a gate stack consisting of a gate dielectric layer 84 formed in direct contact with the top surface 20 of the SOI layer 14 and a gate electrode 86 separated from the top surface 20 by the gate dielectric layer 84. The gate electrode 86, which is considerably thicker than the gate dielectric layer 84, is formed directly on the dielectric layer 84. Candidate dielectric materials for the dielectric layer 84 of each of the field effect transistors 80, 82 include, but are not limited to, $SiO_xN_y$, $Si_3N_4$, $SiO_2$, hafnium-based high-k dielectric materials like hafnium oxide ($HfO_2$) and hafnium silicate ($HfSiO_4$), and layered stacks of these materials. In one specific embodiment, the dielectric layer 84 may be an oxide grown by a wet or dry oxidation process or an oxide deposited by a deposition process like atomic layer deposition (ALD).

The gate electrode 86 of each of the field effect transistors 80, 82 is composed of a conductor characterized by a significantly higher electrical conductivity than the dielectric material in dielectric layer 84. In one embodiment, the conductor is composed of a metal, doped polysilicon, a metal silicide, or a combination of these conductive materials. The gate dielectric layer 84 and gate electrode 86 are fashioned from a layer stack by a conventional photolithography and etching process. Sidewall spacers 88, 90 composed of a dielectric material, such as $Si_3N_4$, may be formed on the sidewalls of the gate electrode 86 of each of the field effect transistors 80, 82 by a conventional spacer formation process.

Source/drain regions 92, 94 are defined for each of the field effect transistors 80, 82 in the semiconductor material of the SOI layer 14 by a series of ion implantation steps. Angled ion implantations may be used to optionally introduce shallow source/drain extensions and halos (not shown) in the SOI layer 14 beneath the sidewall spacers 88, 90 and the sidewalls of the gate electrode 86. Separate contacts (not shown) extend to the gate electrode 86 and source/drain regions 92, 94 of each of the field effect transistors 80, 82. A channel region 96 is defined in the SOI layer 14 beneath each gate electrode 86 between the source/drain regions 92, 94. After the field effect transistors 80, 82 and device structure 70a are completed, standard BEOL processing follows that includes formation of interlayer dielectric layers, conductive vias, and metallization for interconnect wiring levels.

In an alternative embodiment of the invention, the field effect transistors 80, 82 may constitute access devices in memory cells for an eDRAM. The capacitor for each memory cell in the eDRAM is formed using the SOI wafer 10 and shares process steps with the process forming and filling trenches 22, 24, as well as forming doped regions 38, 40.

Device structure 70a may find application as a thermal sensor, or as one of a plurality of identical diodes in a thermal sensor, characterized by a good bulk ideality and used for on-chip temperature measurement in an integrated circuit. The temperature is monitored by supplying an input current from an on-chip or off-chip current source 75 through the device structure 70a in the forward direction. The device structure 70a is responsive to the input current to produce a signal in the form of a voltage across the thermal sensor having a substantially linear relationship to the operating temperature of the integrated circuit. For example, the voltage across the device structure 70a may decrease in a known and reproducible fashion with increasing temperature. The voltage across the forward-biased device structure 70a is measured and related to temperature. Such temperature measurements take advantage of the fundamental relationship between the saturation current of the p-n junction 72 and its temperature, which is described by the diode equation. When using the device structure 70a as a temperature sensor, the ideality factor found in the diode equation may be close to unity. The operation of integrated circuit containing the field effect transistors 80, 82 generates heat that elevates the temperature of the chip.

In an alternative embodiment, device structure 70 (FIGS. 1-3) may also be used as a thermal sensor for temperature measurements. Because of the known temperature and current dependence of the forward-biased base-emitter junction voltage, the device structure 70 can be used to measure temperature by subtracting two voltages supplied at two different bias currents in a known ratio.

Figure 5:
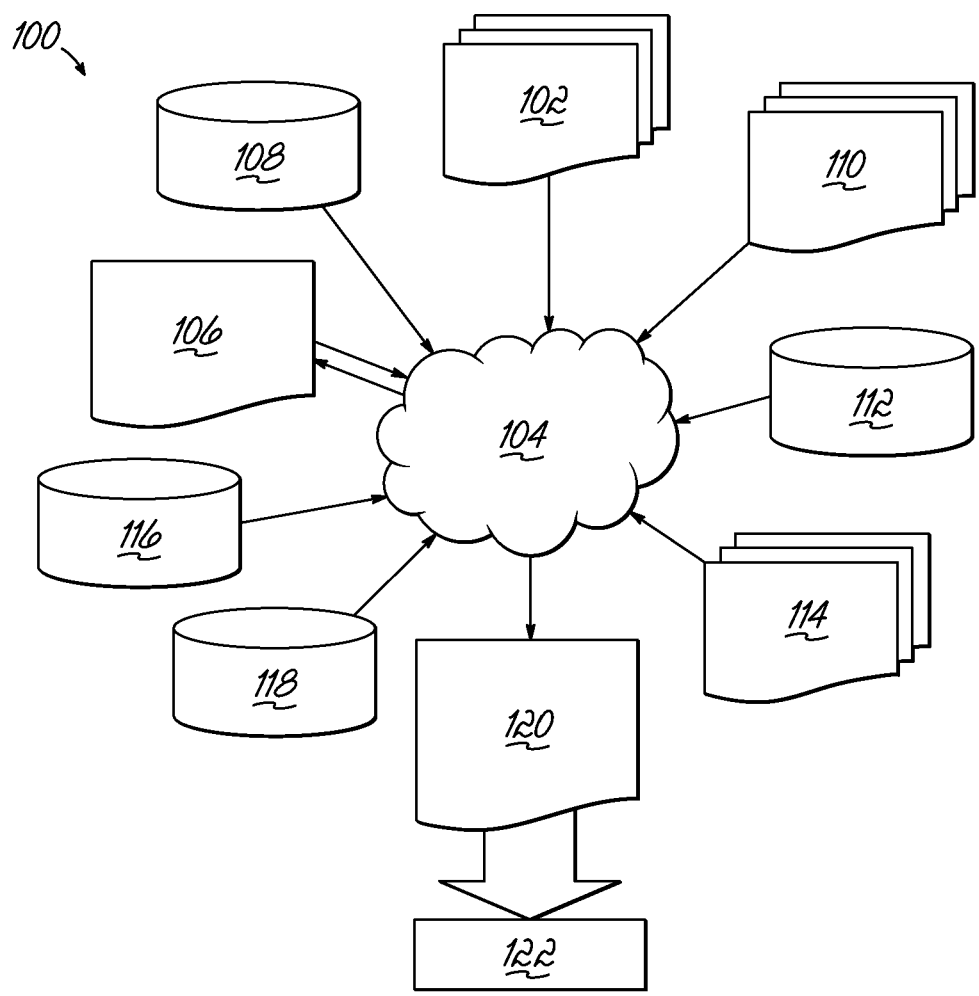
FIG. 5 is a flow diagram of a design process used in semiconductor design, manufacture, and/or test.

FIG. 5 shows a block diagram of an exemplary design flow 100 used for example, in semiconductor IC logic design, simulation, test, layout, and manufacture. Design flow 100 includes processes and mechanisms for processing design structures or devices to generate logically or otherwise functionally equivalent representations of the design structures and/or devices described above and shown in FIGS. 1 and 4. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1 and 4. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1 and 4 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 4. In one embodiment, design structure 120 may comprise a compiled, executable HDL simulation model that functionally simulates the devices shown in FIGS. 1 and 4.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 4. Design structure 120 may then proceed to a stage 122 where, for example, design structure 120: proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of fabricating a device structure using a semiconductor-on-insulator wafer that includes a semiconductor layer, a semiconductor substrate of a first conductivity type, and an insulator layer between the semiconductor layer and the semiconductor substrate, the method comprising:
   forming a first trench extending from a top surface of the semiconductor layer through the semiconductor layer and the insulator layer into the semiconductor substrate;
   at least partially filling the first trench with a first sacrificial plug composed of a doped material containing a dopant having a second conductivity type in the semiconductor substrate that is opposite to the first conductivity type;
   transporting a concentration of a dopant outwardly from the doped material of the first sacrificial plug and into the semiconductor substrate surrounding the first trench to define a first doped region of the second conductivity type in the semiconductor substrate;
   forming a first contact extending from the top surface through the semiconductor layer and the insulator layer to a portion of the semiconductor substrate outside of the first doped region; and
   forming a second contact extending from the top surface through the semiconductor layer and the insulator layer to the portion of the semiconductor substrate.

2. The method of claim 1 further comprising:
   removing the first sacrificial plug from the first trench after the first doped region is defined.

3. The method of claim 2 further comprising:
   after the first sacrificial plug is removed, lining the first trench with a dielectric layer; and
   filling the first trench with a conductive material.

4. The method of claim 1 further comprising:
   forming a second trench extending from the top surface through the semiconductor layer and the insulator layer into the semiconductor substrate;
   at least partially filling the second trench in the semiconductor substrate with a second sacrificial plug composed of the doped material; and
   transporting the dopant outwardly from the second sacrificial plug and into the semiconductor substrate surrounding the second trench to define a second doped region of the second conductivity type in the semiconductor substrate.

5. The method of claim 4 further comprising:
   removing the first sacrificial plug from the first trench and the second sacrificial plug from the second trench after defining the first and second doped regions.

6. The method of claim 5 further comprising:
   after the first and second sacrificial plugs are removed, forming a dielectric layer lining the first and second trenches; and
   filling the first and second trenches with a conductive material.

7. The method of claim 4 wherein the device structure is a bipolar junction transistor, the first doped region is an emitter of the bipolar junction transistor, the second doped region is a collector of the bipolar junction transistor, and the portion of the semiconductor substrate is a base of the bipolar junction transistor.

8. The method of claim 4 further comprising:
   forming a third contact a third contact extending from the top surface through the semiconductor layer and the insulator layer to the second doped region.

9. The method of claim 4 wherein the first and second trenches are concurrently formed and concurrently at least partially filled, and the first and second doped regions are concurrently defined by the dopant transported outwardly from the respective first and second sacrificial plugs into the semiconductor substrate.

10. The method of claim 1 wherein transporting the concentration of the dopant outwardly from the doped material of the first sacrificial plug into the semiconductor substrate further comprises:
    heating the semiconductor substrate and the first sacrificial plug to a temperature sufficient to diffuse the dopant from the first sacrificial plug into the semiconductor substrate surrounding the first trench.

11. The method of claim 10 wherein the outward diffusion into the semiconductor substrate is isotropic about the first trench.

12. The method of claim 1 wherein the doped material in the first sacrificial plug is a doped glass, and at least partially filling the first trench with the first sacrificial plug further comprises:
    depositing the doped material inside the first trench.

13. The method of claim 12 wherein the doped glass comprises an arsenic-doped silicate and the dopant is arsenic.

14. The method of claim 12 wherein the doped glass comprises a boron-doped silicate glass and the dopant is boron.

15. The method of claim 1 wherein forming the second contact further comprises:
    etching an opening extending from the top surface through the semiconductor layer and the insulator layer to the portion of the semiconductor substrate outside of the first doped region; and
    filling the opening with a conductive material.

16. The method of claim 1 wherein forming the first contact further comprises:
    etching an opening extending from the top surface through the semiconductor layer and the insulator layer to the doped region in the semiconductor substrate; and
    filling the opening with a conductive material.

17. The method of claim 1 wherein the device structure is a thermal sensor, and further comprising:
    connecting a current source to the first and second contacts.

18. The method of claim 1 further comprising:
    fabricating the device structure using a first region of the semiconductor layer; and
    fabricating a field effect transistor using a second region of the semiconductor layer different from the first area.

* * * * *